Nov. 16, 1965 R. H. SCHUMAN 3,218,626
CONVERTER DEVICES
Filed Dec. 27, 1960 5 Sheets-Sheet 1

INVENTOR.
RALPH H. SCHUMAN
BY Hudson, Boughton,
Williams, David & Hoffmann
ATTORNEYS INVENTOR.
RALPH H. SCHUMAN
BY Hudson, Boughton, Williams, David & Hoffmann
ATTORNEYS Nov. 16, 1965 R. H. SCHUMAN 3,218,626
CONVERTER DEVICES
Filed Dec. 27, 1960 5 Sheets-Sheet 3

INVENTOR.
RALPH H. SCHUMAN
BY Hudson, Boughton, Williams, David & Hoffmann
ATTORNEYS Nov. 16, 1965 R. H. SCHUMAN 3,218,626

CONVERTER DEVICES

Filed Dec. 27, 1960 5 Sheets-Sheet 4

INVENTOR.
RALPH H. SCHUMAN
BY Hudson, Boughton,
Williams, David & Hoffmann
ATTORNEYS Nov. 16, 1965 R. H. SCHUMAN 3,218,626

CONVERTER DEVICES

Filed Dec. 27, 1960 5 Sheets-Sheet 5

INVENTOR.
RALPH H. SCHUMAN
BY Hudson, Boughton,
Williams, David & Hoffmann
ATTORNEYS United States Patent Office 3,218,626

Patented Nov. 16, 1965

3,218,626

CONVERTER DEVICES

Ralph H. Schuman, Cleveland, Ohio, assignor to The Warner & Swasey Company, Cleveland, Ohio, a corporation of Ohio Filed Dec. 27, 1960, Ser. No. 78,567
16 Claims. (Cl. 340—347)

This invention relates to converter devices and particularly to a device for converting an analogue quantity to a digital quantity.

The invention is applicable to a converter of the type wherein an information member is disposed between a light source and a light responsive unit, and the information member is provided with a zone or track comprised of alternate opaque and transparent areas. As the member is moved past a reading line, the opaque and transparent areas alternately block the transmission of light from the source to the light responsive reading unit.

Two types of converters commonly in use are an incremental pulse generator and an encoder. The pulse generator merely provides an output pulse for each unit of movement of the member and may comprise a single zone made of alternate opaque and transparent areas. An encoder provides a plurality of binary valued signals which constitute a multidigit number that indicates the position of the converter member.

Converters are widely used in machine tools to indicate a unit of movement of a shaft or to indicate shaft position. The pulse generator is generally in the form of a disk having a single zone thereon and the alternate opaque and transparent portions thereof move past a reading line to alternately block and transmit light from the source to a reading unit to provide a train of pulses, one for each unit of movement of the disk.

An encoder is generally in the form of a disk having a number of concentric circular zones of different radii each of which zones represents a separate digit in the multidigit number derived from the disk. Each zone is comprised of alternate transparent and opaque areas representing two different values of the digit represented by the associated zone and adjacent each zone is a reading line at which a light responsive unit for reading the zone is positioned. At any given time the signals from the reading units have either one of two values depending whether an opaque or transparent area is opposite to the particular reading unit, and these signals provide a multidigit number in binary form which is representative of the shaft position.

In a converter of the type described, the reading units comprise light responsive elements such as photocells which provide an output signal dependent upon the amount of light applied thereto. The cells are not line elements and have a finite extent in the direction of movement of the zone past the reading element. Consequently, as a division line between a transparent and an opaque area passes the reading line upon which the cell is positioned, the movement of the division line either gradually uncovers or covers the cell. It therefore requires a finite angular movement of the disk to completely change the cell from light to dark or vice versa, and during the finite disk movement required, the reading of the zone may be ambiguous since the cell output is intermediate its maximum and minimum levels.

To improve reading definition, a mask having a defining slit or slits therein has been used to restrict the light transmitted from the light source through the disk to the cell to a narrow width in the direction of the movement of the zone. In addition, an intermediate level of the output of the cell has been selected as a reference and when the output of the cell or unit reaches this level, suitable control means respond to raise the level of the output to the maximum.

Problems have arisen with the use of a defining slit and a single cell reading unit for each zone. It will be appreciated that if the light source varies in intensity, the angular position of the division line relative to the defining slit which provides the illumination of the cell necessary to cause the reference output will change. As the light intensity increases, the division line need only move a relatively short distance to uncover or cover the cell sufficiently to change the cell output to its reference level. While if the intensity decreases, the cell must be uncovered or covered to a greater extent before the reference level is reached. Consequently, it can be seen that the reference level of the cell output can be reached at any angular position of the division line within the angular extents of the defining slits. This requires the angular dimension of the defining slit to be maintained as narrow as possible, and with the narrow defining slit it is difficult to get sufficient light through the slit to assure reliability in the reading of the zone track. It will be further appreciated that changes in the sensitivity of the cell will also cause a shift in the position of the division line relative to the slit to provide the necessary reference level of the output of the cell.

According to the present invention a novel and improved reading arrangement is provided wherein the angular position of the disk which produces a reference level of the reader output is much less dependent upon the intensity of the light source than heretofore, and wherein a considerably smaller angle of movement of the disk is required to change the output of the reader unit to a reference level than previously possible.

According to one feature of the present invention, two photocells are utilized to read each zone with one of the cells being disposed in the center of an opaque area when the other cell is at the center of a transparent area so that as one cell grows dark as the disk is rotated, the other cell simultaneously grows light, and vice versa. The two cells have their output circuits interconnected to provide a single output signal which begins to change between two values when two division lines are at approximately the center lines of the slits for the two cells so that the cells receive substantially equal illumination. An electrical translating device is connected to the output circuits of the two cells and provides an output quantity which has a first level when one cell receives more light than the other cell and a second level when the other cell receives more light than the one cell with the change being initiated when the cells have substantially equal illumination. Since the output quantity depends upon the difference in illumination received by the cells, the position of the division lines relative to the slits for the zone at which the output quantity begins to change from one level to another level remains substantially the same even though the light source varies in intensity and even though the sensitivities of the cells change as long as the sensitivities of the two cells bear the same relationship to each other.

In accordance with one form of the present invention, the cells are of the electron-generating type, and are connected in opposing relationship across a source of direct voltage with the anode of one cell and the cathode of the other cell connected to a common terminal. This common terminal is the output terminal to which an electric translating device for providing the output quantity is connected. It is observed that the voltage at this terminal changes almost instantaneously between the levels of voltage at the electrodes of the cells remote from the terminal as the division line of a zone moves through its position where the cells receive equal illumination and the voltage wave form at this point will be substantially a square wave.

The current wave form, however, at this terminal does not follow a square wave, but rather has a magnitude during transition periods which depends upon the difference in light received by the two cells, and as a result the current at the terminal will have a wave form where the current increases and decreases during transition periods of the zone.

In accordance with one form of the invention, the translating device is a current translating device and its output quantity follows the current at the terminal and is represented by a curve having a slope during periods of change as the division line moves across the slit. This slope enables the circuit to be rendered insensitive to jittering of the disk when the disk is stopped. Since the output quantity is dependent upon the difference in light received by the two cells, it varies between the extreme levels in approximately one-half the angular movement of the disk required to effect the same change in the output of a single cell for the same slit width.

In accordance with another form of the invention, a voltage responsive device is connected to the terminal and has an output quantity which follows the voltage at the terminal and which changes substantially at the time that the division lines between transparents and opaque areas moving by the slits reach the center lines of the slits where the cells receive substantially equal illumination. A very small angular movement of the disk is effective to cause the voltage change and the angular positions of the division lines relative to the slits necessary to cause the voltage change is independent of variations in intensity of the light source.

The invention also contemplates the provision of a decision element in association with the current translating device to provide further improvement in the reading definition. A decision element suitable for use in the present invention is shown and described in U.S. application S.N. 78,571 filed concurrently herewith, by William J. Frank and assigned to the assignee of the present invention. The decision element operates to produce an output which is switched between two stable states substantially instantaneously when the output of the current translating device increases and decreases to predetermined different levels. The output of the decision element is preferably switched when a division line is as near as possible to a position directly opposite the center line of a slit. In the described and illustrated embodiment the output of the decision element is switched when a division line is within a distance from its opposite position relative to the center line of a slit equivalent to one-eighth of the angular extent of a slit.

The invention also provides means for effecting a conversion for opposing directions of rotation of the shaft so that identical digital representations are obtained for equal angular displacements of the shaft in opposite directions from a reference reading line when a non-symmetrical code is employed. For this purpose the energizing connections of the two cells and the translating device associated with the non-symmetrical zone are changed when the direction of rotation of the shaft is to be changed. The energizing connections for the cells and translating device are conveniently provided by a plug and socket assembly designed to facilitate the changing of the connections.

It is therefore an object of the present invention to provide an analogue to digital converter including an information member movable relative to a source of radiant energy in accordance with movement of a device, the analogue of which is to be converted, with radiant energy responsive information reading means arranged in a novel and improved manner to increase the accuracy and definition of the reading operation.

It is another object of the invention to provide an analogue to digital converter including a disk having transparent and opaque portions and movable in accordance with rotation of a shaft relative to reading means and relative to a mask slit through which light passes to the reading means from a light source, said reading means being arranged to permit the use of a mask slit having a greater angular extent than previously possible.

It is another object of the invention to provide an analogue to digital converter including a disk having transparent and opaque portions and movable in accordance with rotation of a shaft relative to reading means and relative to a mask slit through which light passes to the reading means from a light source, said reading means being arranged to produce an output quantity which changes between two levels at an angular position of the disk which is substantially independent of the intensity of the light source.

It is a further object of the invention to provide an analogue to digital converter including a disk rotatable in accordance with rotation of a shaft with the disk having a zone with alternate transparent and opaque portions and a pair of light responsive devices for reading the zone spaced such that the amounts of light applied thereto during disk rotation change in opposite directions substantially simultaneously during a transition between a transparent portion and an opaque portion.

It is still another object of the invention to provide a device as defined in the preceding object wherein the light responsive devices are connected to a current responsive translating device which produces an output quantity which is a function of the difference in currents resulting from the light responsive devices.

It is still another object of the invention to provide a converter as defined in the next preceding object wherein the light responsive devices are connected to a voltage responsive translating device such that the translating device produces an output quantity having a substantially rectangular wave pattern which varies in accordance with voltage at the point of connection of the translating device to the cells.

It is a further object of the invention to provide a converter including a disk having a zone including transparent and opaque portions and rotatable relative to a pair of light responsive devices spaced along the zone so that the amounts of light applied thereto during disk rotation change in opposite directions substantially simultaneously, a current responsive device connected to the light responsive devices to produce an output quantity which is a function of the difference in currents from the light responsive devices, and a decision element responsive to the output quantity for producing a resultant output which is quickly switched between two stable states when the output quantity increases and decreases to selected values.

It is still another object of the invention to provide an analogue to digital converter including improved means for permitting the accurate reading of digits of a non-symmetrical code inscribed on an information member which is movable in two opposing directions in accordance with movements of a device, the analogue of which is to be converted, so that the digital representations are identical for equal angular displacements of the shaft in the opposite directions.

It is a still further object of the invention to provide an analogue to digital converter including a code disk rotatable relative to a plurality of photocells in accordance with rotation of a shaft with the code disk having inscribed thereon a reflected binary code consisting of a plurality of concentric zones each having alternate transparent and opaque portions and a pair of light responsive devices associated with each zone such that the amounts of light applied to the light responsive devices change in opposite directions substantially simultaneously during transitions between the transparent and opaque portions, and means for connecting each pair of light responsive devices to a translating device in a manner such that identical digital representations may be readily obtained for equal angular displacements of the shaft in opposite directions of rotation of the shaft.

Other objects of the invention will become apparent from the following description taken in conjunction with the accompanying drawings in which similar reference characters designate corresponding parts and in which FIG. 1 is a plan view of an information member in the form of a code disk employed in the present invention;

Figure 3:
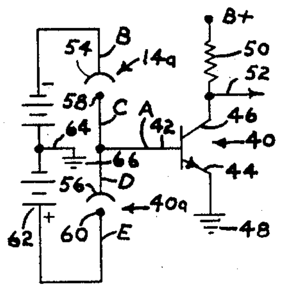
FIG. 3 is a schematic diagram showing a circuit including a pair of photocells and a translating device constituting a reading unit associated with a zone of the code disk of FIG. 1.
Figure 11:
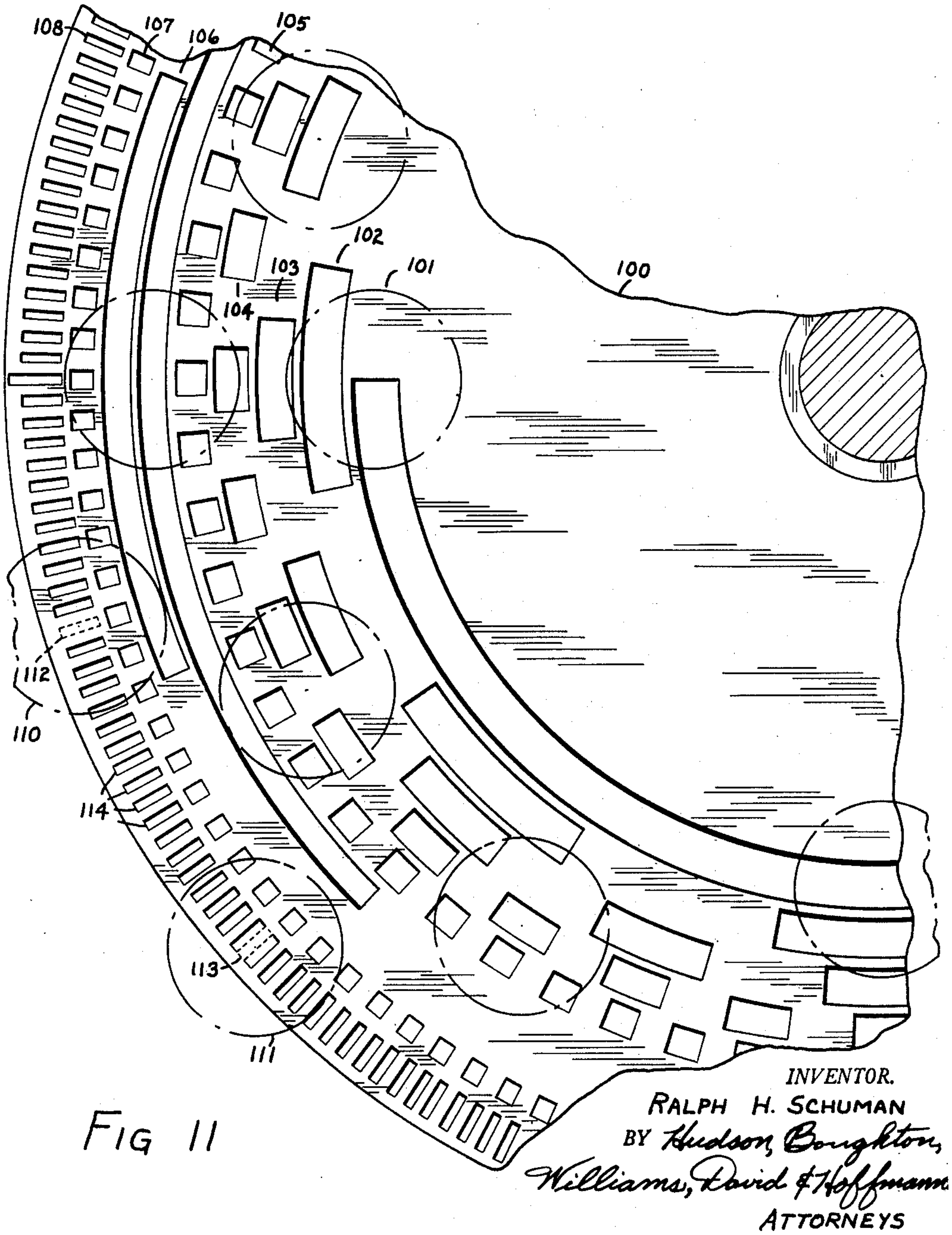
Figure 12:
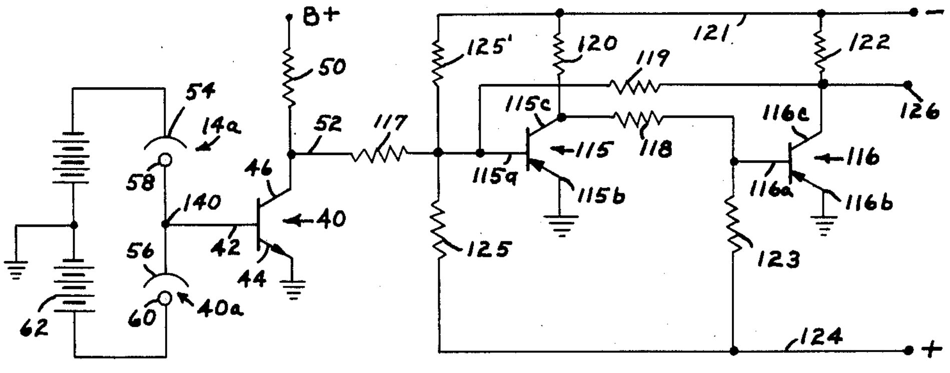
Figure 14:
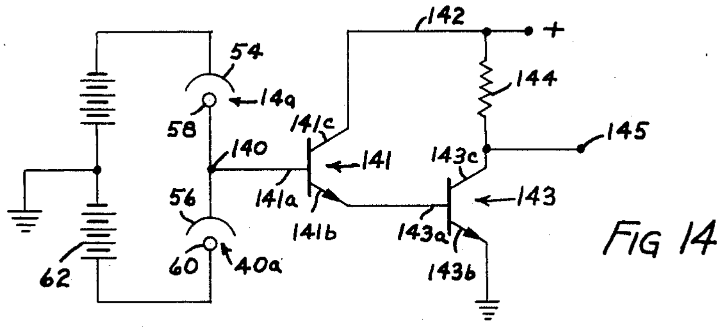
Figure 13:
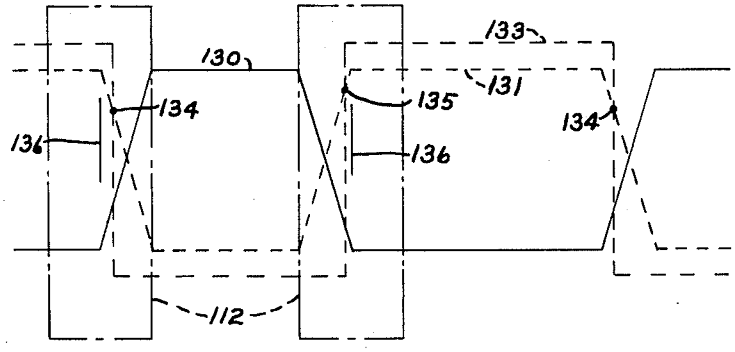
Figure 15:
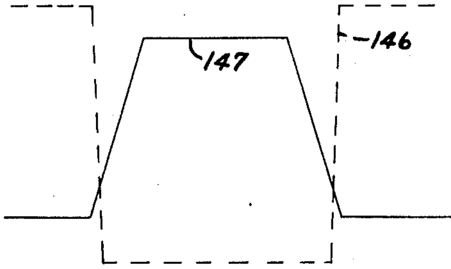

FIGS. 10*a*–10*e* are graphical representations respectively showing curves representing quantities present in the converter device of the present invention;

FIG. 11 is a fragmentary plan view of a disk having an incremental pulse generating zone;

FIG. 12 is a schematic diagram showing a system wherein the reading unit of FIG. 3 is connected to a decision element;

FIG. 13 is a graphical representation showing curves representative of various quantities present in the system of FIG. 12;

FIG. 14 is a schematic diagram showing the reading unit of FIG. 3 connected to a voltage responsive translating device; and FIG. 15 is a graphical representation showing a full line curve representing a current of the reading unit of FIG. 3, and showing a broken line curve representing a voltage of the unit of FIG. 3.

While the present invention is susceptible of various modifications and constructions, it is employed with particular advantage in the conversion of an analogue quantity to a digital quantity wherein an information wheel or disk is rotated relative to a plurality of photocells in accordance with rotation of a shaft, the analogue of which is to be converted. As an example, the present invention may be employed to continuously indicate in digital form the angular position of a rotatable shaft, such as the lead screw in a machine tool.

Figure 2:
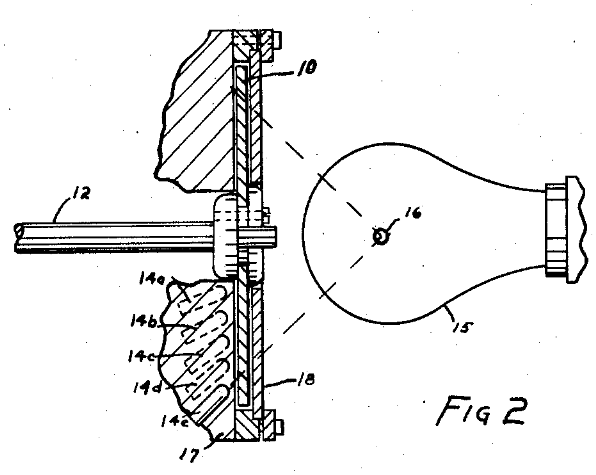
FIG. 2 is a view in side elevation with parts shown in section and with parts broken away showing the disk of FIG. 1 operatively positioned with respect to a plurality of photocells and a light source.

Referring now to the drawings, there is illustrated in FIG. 2 a portion of a converter device embodying the teachings of the present invention which is arranged to convert an analogue quantity to a digital representation. The converter device includes an information member 10 which in the illustrated embodiment is in the form of a code bearing wheel or disk attached to a shaft 12 for rotation with the shaft. The shaft 12 may be operatively connected to a device (not shown) the analogue of which is to be converted. For example, the shaft 12 may be rotated in accordance with, or may itself comprise, a lead screw of a machine tool the angular position of which is to be continuously represented in digital form.

The encoder disk 10 is rotatable relative to a plurality of radiant energy responsive reading devices shown in the form of photocells of the electron generating type. It is understood that the reading devices may assume other forms, such as semiconductor photodiodes, etc. In FIG. 2 five photocells are illustrated and these cells are designated respectively by the reference characters **14*a*–14*e*. The photocells are arranged in a reading line to receive light from a suitable source of radiant energy shown in the form of an incandescent lamp 15 having a filament 16 and which is positioned on the side of the disk 10 opposite to the side containing the photocells 14*a*–14*e*. The cells 14*a*–14*e* are mounted within a plurality of bores formed in a frame 17 such that the cells radiate from the filament 16 to extend in the direction of light rays emanating from the filament. As is understood in the art, each cell produces an output current which has a magnitude dependent upon the amount of light applied thereto. The disk 10 is rotatable with respect to a mask 18 which in the illustrated embodiment is positioned between the disk and the light source 15** and which has transparent slits opposite the cells in each reading unit and between the cells and the filament.

Figure 1:
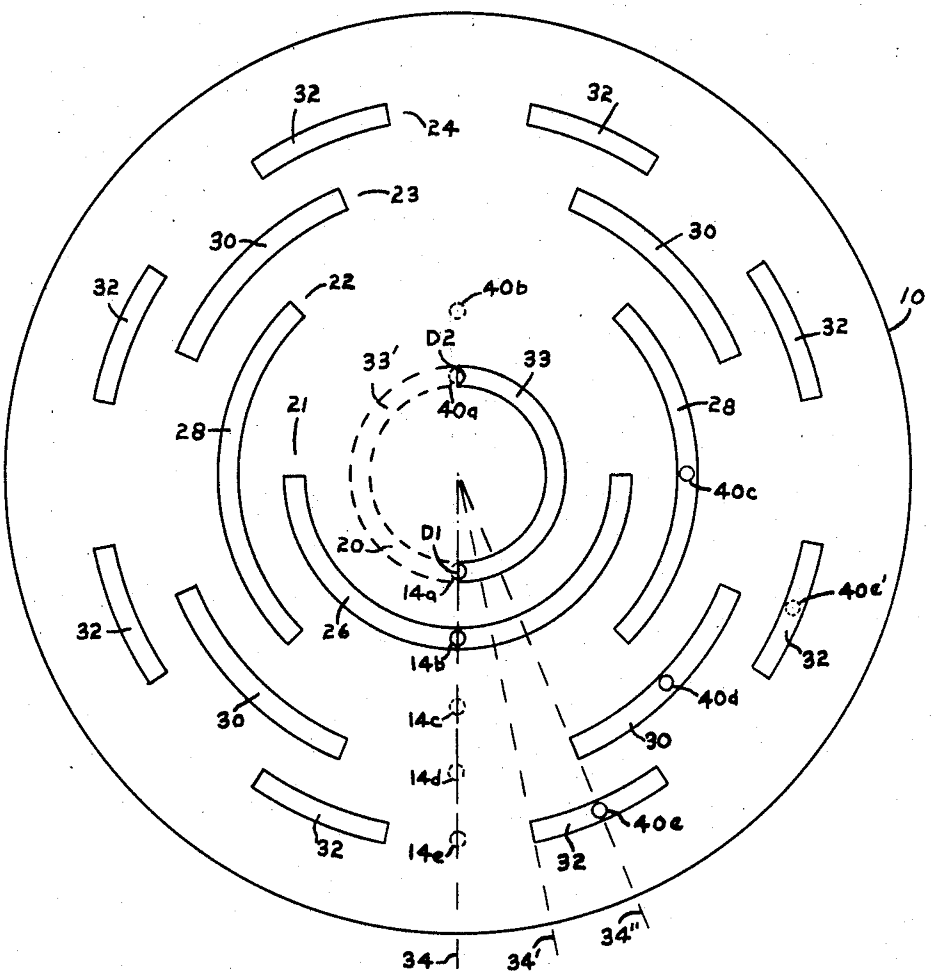

The code disk 10 is illustrated in plan in FIG. 1 and as there shown includes a plurality of concentric zones 20, 21, 22, 23 and 24 having different radii. The zones 20–24 represent digits of a code inscribed in binary form on the disk. In the illustrated embodiment the inscribed code employed is the Gray code or reflected binary code but it is understood that the invention is also applicable to the reading of any code in binary form.

Each of the zones 20–24 includes a plurality of divisions shown as comprising transparent and opaque portions disposed in alternation along the associated zone. The transparent and opaque portions may be provided in any suitable manner. As an example, the disk 10 may comprise an opaque glass plate having transparent sections which constitute the transparent portions. As a further example, the transparent portions may be in the form of slits or openings of the disk and the opaque portions may constitute the material of the disk between the slits. Photographic-etching techniques are also applicable to the forming of the transparent portions.

It is noted with reference to FIG. 1 that the transparent and opaque portions in each zone are of equal length and that the number of such portions in a particular zone is one-half the number of the portions in the adjacent zone of greater radius. An exception to this is the number of transparent and opaque portions in the coarsest zone 20 which is equal to the number of portions in the next coarsest zone 21. The zone 21 includes a single transparent portion 26 and a single opaque portion. The next zone 22 displaced outwardly from the zone 21 includes a pair of transparent portions 28, the zone 23 includes four transparent portions 30, and the finest zone 24 includes eight transparent portions 32. The coarsest zone 20 has a single transparent portion 33 and it is observed that the transparent portions 26 and 33 extend through angles of one hundred and eighty degrees and are spaced angularly relative to each other by ninety degrees.

In order to read a code inscribed in binary form on a code disk, such as the disk 10, it is conventional practice to provide a fixed reading line extending parallel to radii of the code disk. As an example, a reading line represented by the broken line 34 is shown in FIG. 1 and this line contains the photocells **14*a*–14*e* which are represented by circles and which are positioned along the line 34 such that a separate photocell is associated with each of the zones 20–24. The number indicated by the outputs of the cells changes each time the disk rotates through a certain angular distance which is the distance between broken lines 34′ and 34″. The lines 34′ and 34″** are shown spaced by an angle of the order of eleven degrees, and accordingly, with the five digit code shown there are thirty-two changes of digit combinations for one revolution of the disk. This means that the encoder can discriminate thirty-two quantum steps or angular positions.

The slits and opaque portions in each zone represent respectively two different values of the digit which is represented by the associated zone. For example, the slit 33 may represent a value 0 and the associated opaque portion may represent a value 1 of the digit represented by the zone 20. The disk 10 is shown as having a five digit reflected binary code inscribed thereon but it is understood that codes having any desired number of digits may be utilized.

It is understood that as the disk 10 rotates relative to the photocells 14*a*–14*e*, the light applied to the photocells through the mask slits will be periodically blocked by passage of the opaque portions between the filament 16 and the photocells. At any given time the combination of output signals produced by the photocells in a particular reading line constitutes a digital representation of the angular position of the disk 10 and consequently of the angular position of the shaft connected to the disk.

It is noted with reference to FIG. 1 that when the disk 10 is moved with respect to the photocells, transition periods occur during which the dividing lines between opaque portions and adjacent transparent portions are passing by the mask slits. Readings taken during such transition periods may be inaccurate due to the varying signals produced by the photocells resulting from changes in the amounts of light applied thereto during transitions. When a single cell reader unit is employed the angular position of the disk at which the reference value of the cell current is attained varies within the angular extent of the mask slit in dependence upon the cell sensitivity and the intensity of light from the source. This causes reading errors the severity of which depend upon the angular extent of the mask slit.

In the present invention the chance of errors in a code reading operation is materially reduced by the provision of a pair of photocells in association with a zone for reading the zone. The photocells of each pair are spaced by a distance such that the amounts of light applied thereto change in opposing directions substantially simultaneously during a transition period. As shown in FIG. 1, additional photocells represented by circles 40*a*–40*e* are associated respectively with the cells 14*a*–14*e* to provide a separate pair of cells for each digit zone.

Figure 9:
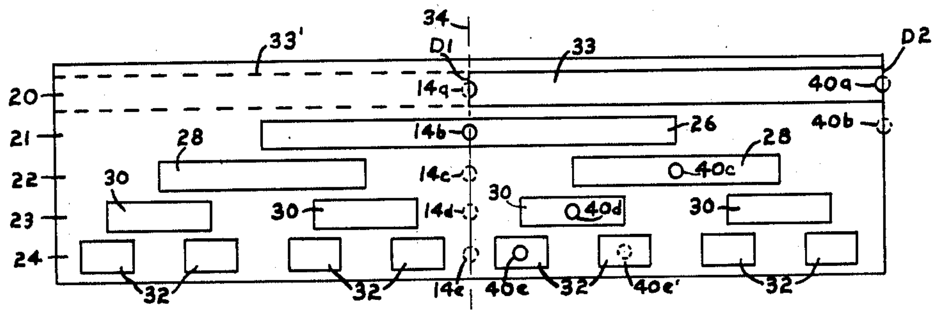
FIG. 9 is a diagrammatic representation showing in developed form the arrangement of the code inscribed on the disk of FIG. 1.

The photocells of each pair constitute a digit reading unit for the associated zone and are shown in FIG. 1 spaced by a distance which is substantially equal to the length of a division or a value indicating portion of the associated digit zone. For example, the photocells 14*a* and 40*a* associated with the zone 20 are spaced by an angular distance of approximately one hundred and eighty degrees, which is the length of the transparent portion 33 or the associated opaque portion. This arrangement is also illustrated in FIG. 9, which is a diagrammatic representation in developed form showing the transparent and opaque portions included in the various zones on the disk 10. The photocells 14*a*–14*e* are shown in FIG. 9 positioned along the fixed vertical reading line 34 which is parallel to a radius of the disk 10, and the associated cells 40*a*–40*e* are shown spaced from the cells 14*a*–14*e* by the proper distances.

In one form of the invention each pair of photocells is connected to a separate current responsive translating device such that the translating device produces a current dependent output voltage having a first level when one of the photocells receives more light than the other, and having a second level when the other photocell receives more light than the light received by the one cell. These two levels of the output voltage produced by the translating device represent respectively the two different values of the digit which is represented by a particular zone. Referring now to FIG. 3, there is schematically shown a circuit including a pair of photocells and a current responsive translating device associated with a particular digit zone. The circuit of FIG. 3 will be described in association with the zone 20 and a plurality of such circuits are employed each with a separate one of the zones.

The photocells 14*a* and 40*a* associated with the zone 20 are connected to a current responsive translating device preferably in the form of a transistor 40 which produces an output voltage which is a function of the difference between currents of the cells and which is indicative of the value of the digit represented by the zone 20 which is being read. The transistor 40 is shown in the form of an NPN transistor having a base electrode 42, an emitter electrode 44 and a collector electrode 46. However, the transistor 40 may be of the PNP type if desired. The emitter 44 is shown connected to ground as at 48 and the collector 46 is connected to a source of positive potential designated by the reference character B+ through a resistor 50. An output conductor 52 is connected between the collector 46 and the lower terminal of the resistor 50.

The cells 14*a* and 40*a* include respectively cathodes 54 and 56 and anodes 58 and 60. The base electrode 42 of the transistor 40 is connected to the anode 58 of the cell 14*a* and to the cathode 56 of the cell 40*a*. The cathode 54 of the cell 14*a* and the anode 60 of the cell 40*a* are connected respectively to negative and positive terminals of a source of direct voltage shown in the form of a battery 62 having a center tap connection 64 connected to ground as at 66.

When the amounts of light applied to the cells 14*a* and 40*a* are substantially equal, which indicates that the transition lines D1 and D2 between the transparent portion 33 and the adjacent opaque portion in the zone 20 are directly opposite the cells 14*a* and 40*a* as shown in FIGS. 1 and 9, the cell currents are equal and zero current flows between the base 42 and the emitter 44. Accordingly, the transistor 40 is substantially nonconductive which gives rise to an output voltage on the conductor 52 having an upper level which is substantially the B+ value. The same condition prevails when the amount of light applied to the cell 14*a* is greater than that applied to the cell 40*a*, and zero current flows between the base 42 and the emitter 44 so that the voltage on the conductor 52 is at its upper level to thereby indicate a particular value of the digit being read which value will be assumed to be 1. The foregoing condition occurs when the transition lines D1 and D2 between the transparent portion 33 and the assocated opaque portion have just passed by the cells 14*a* and 40*a* respectively as the disk 10 is rotated in a clockwise direction as viewed in FIG. 1.

When the cell 40*a* receives more light than the cell 14*a*, current flows from the base 42 to the emitter 44 and the transistor 40 is rendered conductive whereby the output voltage appearing on the conductor 52 is at a lower level than the level of voltage appearing thereon when zero current flows between the base and the emitter. This lower voltage level will be assumed to indicate a value 0 of the digit. The latter condition occurs when the transition lines D2 and D1 pass the cells 14*a* and 40*a* respectively during continued clockwise rotation of the disk 10.

It is thus seen that the output voltage on the conductor 52 has a magnitude which is a function of the difference between currents from the cells 14*a* and 40*a* and this magnitude is indicative of the value of a digit represented by the zone 20 associated with the cells 14*a* and 40*a*. As previously assumed, when voltage on the conductor 52 is at its upper level, a digit value 1 is indicated, and when such voltage is at its lower level, a digit value 0 is indicated. The described digit reading arrangement results in less chance of ambiguous readings than previously possible inasmuch as voltage on the conductor 52 changes between its upper and lower levels in one-half the angular movement of the disk required for a variation of the current produced by a single photocell between its extreme levels for a given slit width as heretofore employed. The variation of the current difference between the cells 14*a* and 40*a* between its extreme levels occurs during rotation of the disk through an angle equal to one-half the width of a slit, and such variation is twice the change in current of a single cell during such disk rotation for a given slit width. Consequently, the maximum range of disk movement required to change the two cell difference in current between its extreme levels due to changes in intensity of the light source is limited to one-half the width of a slit. This allows the use of wider slits with the two cell arrangement than heretofore practical with a single cell reader.

The invention may be further explained with reference to FIGS. 10a–10e which are graphical representations showing curves indicating variations of the amounts of light applied to a pair of cells, such as the cells 14a and 40a, variations of currents produced by such cells, and variation of current flowing between the base and emitter of the transistor 40 during rotation of the code disk 10.

Figure 10A:
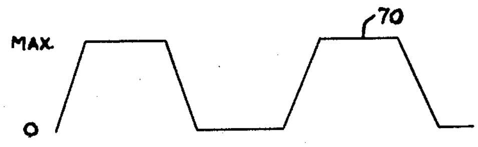
Figure 10B:
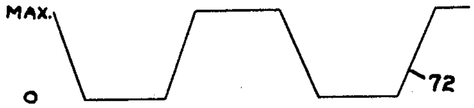

FIGS. 10a and 10b illustrate respectively curves 70 and 72 showing variations in the amounts of light applied to the cells 14a and 40a during rotation of the disk. It is seen that the amounts of light vary in opposing directions substantially simultaneously as the disk rotates and that a predetermined angular movement of the disk 10 is required for the amounts of light to vary between zero and maximum values.

Figure 10C:
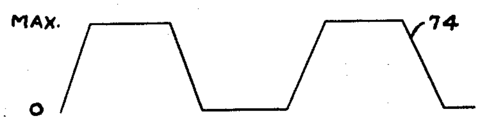
Figure 10D:
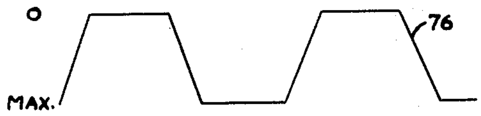

FIGS. 10c and 10d illustrate curves 74 and 76 showing the currents resulting from the cells 14a and 40a when the amounts of light represented by the curves 70 and 72 are applied to the cells 14a and 40a. It is noted that the currents from the cells have magnitudes dependent upon the amounts of light applied thereto and that a predetermined angular movement of the disk is likewise required for these currents to vary between zero and maximum values during transition periods.

Figure 10E:
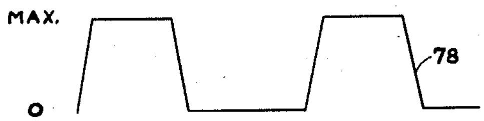

The curves 78 in FIG. 10e illustrates the variations of current flowing between the base 42 and the emitter 44 of the transistor 40 during rotation of the disk 10. It is observed that when the cells are equally lit or when the cell 14a receives more light than cell 40a, the current represented by the curve 78 has a zero magnitude, and when the cell 40a receives more light than the cell 14a this current increases above the zero axis to its maximum level which is attained when the cell 40a is light and the cell 14a is dark. It is noted that the angular movement of the disk 10 during which the base current is varying between a zero value and a maximum value is approximately one-half the angular movement of the disk during which the current from a particular photocell is varying between a zero value and a maximum value. As a result, the reading definition is improved by a factor of two with the arrangement of the present invention as compared to the single cell reader when mask slits are employed having the same angular extent. The output voltage appearing on the conductor 52 varies in dependence upon the base current and the emitter-collector current, and since the output voltage is an amplified replica of the base-emitter current, it affords a very accurate representation of the value of a digit.

Since the output voltage at conductor 52 begins to change between its digit indicating levels when equal amounts of light are applied to the two cells, the position of the disk at which such change begins is independent of the intensity of the light source and of the sensitivities of the cells so long as such sensitivities have the same relationship. As a result, the two cells may have a wide range of sensitivities without changing the position of the disk effective to initate the voltage change. For example, two cells of high sensitivity may be employed, or two cells of low sensitivity may be used and the same disk position to produce the voltage change will be required in either case.

In FIGS. 1 and 9 the cells of the pair associated with each zone are shown spaced by a distance equal to the length of a division or transparent portion included in the zone. In certain applications the spacing of the cells may differ from that illustrated. To illustrate this, if a code disk is inscribed with a code in binary form having a greater number of digits than the five digit code shown, the number of divisions in the finest zone is considerably greater than the number of divisions in the finest zone 24, and the divisions are therefore more closely spaced. For example, if a nine digit code is employed the finest zone contains one hundred and twenty-eight transparent portions which necessarily have small length dimensions in a code disk of conventional size. It therefore may become impractical to space the two cells of the reading unit in this zone by a distance equal to the length of a transparent or opaque portion due to the limited space available.

It has been observed that in the present invention the cells of a pair may also be spaced by a distance which is an odd whole number multiple other than one of the length of a transparent or opaque portion. As an example, the cell 40e of FIG. 9 may be displaced from its illustrated position to the position indicated by the dotted circle 40e'. The cells 14e and 40e' are spaced by a distance equal to three times the length of a portion 32 and the amounts of light applied thereto will vary in opposite directions substantially simultaneously in the same manner as when the cells are spaced by a distance equal to a unit length. Other spacings may also be utilized as desired, such as five, seven, etc. times the length of a transparent or opaque portion.

In certain applications it may be desired to represent in digital form the angular position of a shaft which is capable of rotation in two opposing directions. In such applications it is desirable that the angular position of the shaft for each direction of rotation measured from the zero or reference reading line be represented by the same digital information. In other words, equal angular positions of the shaft on either side of the zero reading line 34 should be indicated by the same binary number.

In the particular code inscribed upon the code disk is symmetrical with respect to the zero reading line, which is assumed to constitute the fixed reading line 34 including the cells 14a–14e, identical digital representations will be provided for equal angular displacements of the shaft in the opposite directions. However, it is observed that the reflected binary code inscribed on the disk 10 is not symmetrically related to the reading line 34 since the transparent portion 33 of the zone 20 is positioned entirely on the right hand side of such reading line as viewed in FIG. 1. Consequently, if the disk 10 is rotated in opposite directions different digital representations would be provided for equal shaft displacements in such directions.

According to the present invention an improved arrangement is provided to effect an accurate analogue to digital conversion for either direction of rotation of a shaft so that the digital representations are identical for the same displacements of the shaft in such directions when a non-symmetrical code is employed. It is noted that when the reflected binary code is utilized, the desired identical digital representations for equal shaft displacements in opposite directions would be realized if for clockwise rotation of the disk 10 as viewed in FIG. 1 the portion 33 were positioned as shown, and for counterclockwise rotation the portion 33 were positioned on the left-hand side of the reading line as illustrated by the dotted line portion 33'.

This reversal is accomplished in effect in the present invention by changing the energizing connections for the photocells 14a and 40a and the transistor 40 associated with the non-symmetrical zone 20 when the direction of shaft rotation is changed. The connections for the cells and the transistors associated with zones other than the zone 20 need not be changed inasmuch as the transparent and opaque portions in these other zones are symmetrical relative to the line 34 and the same values of the digits represented by the other zones will result for equal angular displacements of the shaft in opposite directions.

Figure 4:
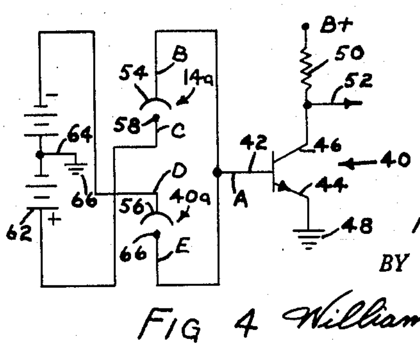
FIG. 4 is a view similar to FIG. 3 showing a different connection arrangement of the photocells and the translating device.

FIG. 4 illustrates energizing connections of the cells 14a and 40a and the transistor 40 which differ from the connections shown in FIG. 3. The connections shown in FIG. 4 are effective to provide an output voltage on the conductor 52 which is the same digital representation of shaft displacement in one direction as the representation resulting from the circuit of FIG. 3 for shaft displacement in the opposite direction.

It will be recalled that if the connections of FIG. 3 are employed and the disk 10 is rotated in a clockwise direction from the position shown in FIG. 1, the cell 14*a* receives more light and the output voltage on conductor 52 indicates a 1. When the connections of FIG. 4 are utilized and the disk is rotated in a counterclockwise direction, the cell 40*a* receives more light and the output voltage on conductor 52 still indicates a 1. This may be explained by considering that when the cell 40*a* in FIG. 4 receives more light, zero base-emitter current flows which is the same condition occurring when the cell 14*a* in FIG. 3 receives more light. Consequently, the same values of the digit represented by the zone 20 are obtained for equal displacements of the disk in opposite directions when the connections are changed as described.

Figure 5:
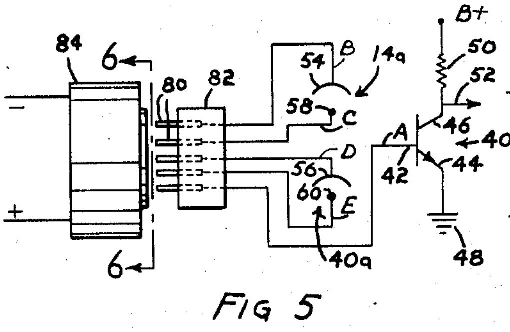
FIG. 5 is a diagrammatic representation showing a plug and socket construction adapted to connect a pair of photocells and a translating device in the manner of FIG. 3.
Figure 7:
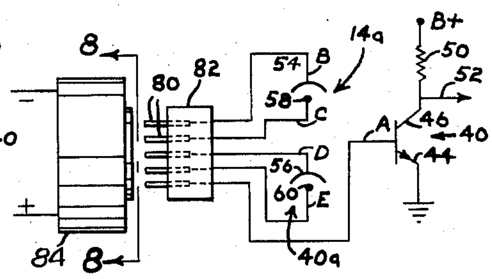
FIG. 7 is a view similar to FIG. 5 showing a plug and socket construction adapted to connect the pair of photocells and the translating device in the manner of FIG.4.
Figure 6:
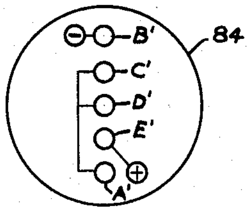
FIG. 6 is a view taken along the line 6—6 of FIG. 5.

The energizing connections for all of the cells and the associated transistors are conveniently provided by means of a plug and socket arrangement. The socket portion may be mounted in any suitable manner such as by the frame 17 to receive terminals of the plug which are connected to conductors leading to the cells and transistors. As shown in FIG. 5, the photocells 14*a* and 40*a* and the transistor 40 are connected to a plurality of terminals 80 of a plug 82 such that the conductors designated respectively by the reference characters A–E are each connected to a separate one of the terminals 80. The terminals of the plug 82 and conductors leading to the cells and transistors associated with the remaining zones are not shown in FIG. 5. The terminals 80 are adapted to be received within electroconductive sockets represented by circles designated respectively by the reference characters A′–E′ of a socket element 84, or in the case of plug 82 for the cells of the coarsest zone, by the sockets A′–E′ of a socket element 84′, best shown in FIGS. 6 and 8, so that the conductors A–E are connected respectively to the sockets A′–E′ through the terminals 80.

In the plug element 84, the sockets B′ and E′ are respectively electrically connected by connections to terminals represented by circles having the characters — and + therein which are connected respectively to the positive and negative terminals of the battery 62. Also, the socket A′ of element 84 is connected by connections to the sockets C′ and D′. With the arrangement of FIGS. 5 and 6 the photocells 14*a* and 40*a* and transistor 40 are connected to each other and to the battery 62 in the manner shown in FIG. 3 such that the conductor A is connected to the conductors C and D, and the conductors B and E are connected respectively to the negative and positive terminals of the battery. These connections are utilized for one direction of rotation of the disk 10 such as a clockwise direction.

Figure 8:
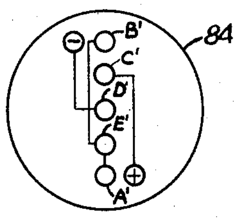
FIG. 8 is a view taken along the line 8—8 of FIG. 7.

When it is desired to provide a digital representation of the angular position of a shaft which effects rotation of the disk 10 in the opposite direction such as the counterclockwise direction, the connections shown in FIG. 4 are employed for the coarsest zone 20, as hereinbefore explained, and these connections may be made through the socket element 84′ cooperating with the plug 82 with the connections between the positive and negative terminals, on one hand, and the sockets A′–E′ on the other hand, being as shown in FIG. 8 to provide the polarities for the cells as shown in FIG. 4. The connections of FIG. 4 are provided by electrically connecting the sockets B′ and E′ to the socket A′ of the element 84′. In addition, the socket C′ is connected to the + socket and the socket D′ is connected to the — socket. When the terminals 80 of the plug 82 are inserted into the sockets A′–E′ such that the conductors A–E are connected respectively to the sockets A′–E′, the circuit connections shown in FIG. 4 are obtained.

The invention is also applicable to an incremental pulse generator which provides an output pulse for each unit of movement of the disk. Such a generator normally includes a disk having a single zone including divisions in the form of transparent and opaque portions. Referring to FIG. 11, there is illustrated an information disk 100 which has been successfully employed as both an encoder disk and an incremental pulse generator disk. The disk 100 includes a plurality of circular concentric zones 101–108 each including alternate transparent and opaque portions to provide a code in reflected binary form. Each of the zones has associated therewith the two cell reading unit of the present invention.

When the disk 100 is utilized as an incremental pulse generator, the finest zone 108 alone is employed and a reading unit consisting of two cells 110 and 111 corresponding to the cells 14*a* and 40*a* are associated with the zone 108. A mask (not shown in FIG. 11) is provided and includes a pair of defining slits 112 and 113 opposite the cells 110 and 111. Light from a light source (not shown) passes through the mask slits and the transparent portions 114 of the zone 108 to the cells 110 and 111 as the disk rotates. As stated hereinbefore, the two cell reader unit of the present invention permits the provision of mask slits having substantial angular extents which allows more light to be applied to the cells than in previous arrangements. As shown in FIG. 11 the slits 112 and 113 have angular extents substantially equivalent to the angular extent of one division of the zone 108.

The substantial angular extents of the mask slits give rise to a resultant current-dependent output from the two cell reader unit having a slope during a transition period, and the angular extents of the slits 112 and 113 may be selected to provide an output curve having a slope effective to accommodate disk jitter which may be present in certain applications, such as machine tool applications, and which normally produce extraneous pulses in the pulse generating operation. In other words, disk jitter of less amplitude than the angular extent of a mask slit can be accommodated without generating extraneous pulses.

The slope of the output curve allows the use of a decision element to provide excellent reading definition. A decision element suitable for purposes of the invention is shown in FIG. 12 connected for energization from the two cells of the reader unit. The decision element illustrated includes a pair of transistors 115 and 116 having respectively base, emitter and collector electrodes designated by the reference numeral employed for the transistors having the suffixes *a*, *b* and *c* added thereto respectively. The decision element operates as a regenerative amplifier to produce an output which is switched substantially instantaneously between two stable states when the input thereto increases and decreases to predetermined different levels.

The base 115*a* of the input transistor 115 is connected to the conductor 52 through a resistor 117, and the collector 115*c* of transistor 115 is connected to the base 116*a* of the output transistor 116 through a resistor 118. The collector 116*c* of transistor 116 is connected to the base 115*a* of transistor 115 through a feedback circuit including a resistor 119. The collector 115*c* is connected through a resistor 120 to a conductor 121 having a negative potential applied thereto, and the collector 116*c* is connected to the conductor 121 through a resistor 122. A resistor 123 is connected between the base 116*a* and a conductor 124 which has a positive potential applied thereto. Resistors 125 and 125′ are connected respectively between the base 115*a* and the conductors 124 and 121. An output terminal 126 is connected to the collector 116*c* and the output voltage of the decision element is derived from the terminal 126.

The transistors 115 and 116 are normally in conductive and nonconductive conditions respectively when the voltage at conductor 52 is at its lower level, or when the base current of transistor 40 is a maximum, which occurs when the cell 40*a* is light and the cell 14*a* is dark. The arrangement is such that when the voltage at the conductor 52 increases from its lower level to a selected value, or when the base-emitter current of transistor 40 decreases from its maximum to a selected level, which occurs when the light applied to cell 40*a* is greater than that applied to cell 14*a* and is decreasing from its maximum amount, the transistor 115 is rapidly switched to a nonconducting condition and the transistor 116 is rapidly switched to a conductive condition. Conversely, when the voltage at conductor 52 decreases from its upper level to a selected value, or when the base-emitter current of transistor 40 increases from zero to a selected level, which occurs when the amount of light applied to cell 40*a* is increasing beyond that applied to cell 14*a*, the transistors 115 and 116 are rapidly transferred respectively back to their conductive and non-conductive conditions. The result of this action is the production of a voltage at the output terminal 126 having a substantially rectangular waveform and which is switched between two stable states when the voltage at conductor 52 is increased and decreased to selected different values.

The invention may be further described with reference to FIG. 13, which is a graphical representation illustrating curves representative of the base-emitter current of transistor 40 and the voltage appearing at the conductor 52 related to disk rotation. The base emitter current of transistor 40 is represented by the full-line curve 130 and the voltage at conductor 52 is represented by the broken line curve 131 which is inverted relative to curve 130. Also shown in FIG. 13 are two broken rectangles superimposed upon the curves 130 and 131 and each representing one of the mask slits, such as the mask slit 112, to illustrate the positions of the sloping portions of the curves 130 and 131 relative to the slit 112. The output voltage of the decision element appearing at the terminal 126 is represented by the broken line curve 133.

It is seen with reference to FIG. 13 that when the voltage at the conductor 52 decreases from its upper level to a preselected level represented by the dot 134 on the curve 131, the output voltage represented by the curve 133 is rapidly switched from its upper level to its lower level. This is accomplished by the input transistor 115 being transferred from nonconduction to conduction and the output transistor 116 being transferred from conduction to nonconduction by application of an input voltage to transistor 115 having the level indicated by the dot 134. The output voltage of the decision element remains at its lower level until the voltage at conductor 52 is increased from its lower level to a level indicated by the dot 135 on the curve 131. When this occurs the transistors 115 and 116 are transferred respectively to their nonconductive and conductive conditions whereby the output voltage represented by the curve 133 is switched to its upper level.

It is noted that the output curve 133 is nonsymmetrical in that its upper horizontal portion is more elongated than is lower horizontal portion. Such nonsymmetry is the result of switching the output voltage when a division line is angularly spaced from the center line 136 of the mask slit 112 wherein unequal amounts of light are applied to the cells, and this may cause errors in the converting operations, particularly when a digitizer is employed. The nonsymmetry would be eliminated if the output voltage were switched when a division line was directly opposite the center line of a mask slit at which time equal amounts of light would be applied to the cells assuming the cells have equal sensitivities. This would be equivalent to positioning the dots 134 and 135 at the extreme upper points of the sloped portions of the curve 131 in vertical alignment with the center line of the mask slit. Preferably, the output voltage is switched for positions of the division lines which are as near as possible to being directly opposite the center lines of the mask slits.

In the illustrated and described embodiment of the invention the voltage levels represented by the dots 134 and 135 effective to switch the output voltage are selected so as to occur when a division line is within an angular distance from the center line of a mask slit equivalent to one-eighth of the angular extent of a mask slit. In FIG. 13 the voltage level of the point 134 at which the output voltage is switched to its lower level is selected to occur when a division line is at such one-eighth distance relative to the center line of a mask slit, and the voltage level of the point 135 at which the output voltage is switched to its upper level is selected to occur when a division line is spaced from the center line of a mask slit by an angular distance which is less than the one-eighth distance.

It is found that the nonsymmetry of the output voltage curve 133 resulting from the described arrangement is tolerable in pulse generating applications wherein the zone of a disk has a resolution as high as one thousand and twenty-four pulses per revolution of the disk. Further, the angular positions of the disk effective to produce the voltage levels which effect the switching action are considerably less dependent upon the intensity of the light source than in previous arrangements.

It is noted that a voltage differential is established by the voltage levels indicated by the points 134 and 135. This voltage differential is effective to accommodate a certain amount of disk jitter so that the output voltage of the decision element is not switched between its upper and lower levels in response to disk jitter which causes variations in the voltage represented by curve 131 within the voltage differential. The levels of the input voltage represented by curve 131 at which the output voltage represented by curve 133 is switched may be varied over a considerable range by proper selection of the values of the resistors 117 and 119.

If desired the transistor 40 may be eliminated and the decision element connected directly to the point 140 between the cells 14*a* and 40*a*. The decision element described is a current responsive device and will respond to the difference in currents of the two cells when connected directly to the cells. Further details of the construction and operation of the decision element may be found in the aforementioned Frank application.

The two cell reader unit previously described may be associated with a voltage responsive translating device to provide excellent reading definition. This arrangement is shown in FIG. 14 wherein a two cell reader unit of either an encoder or an incremental pulse generator is connected to a voltage responsive translating device such that the device produces a voltage dependent output of substantially rectangular waveform which is switched between two extreme levels in response to a very small angular rotation of the information disk. In this arrangement the position of the disk effective to cause the voltage change is independent of the intensity of the light source since the voltage change is initiated as soon as one cell receives slightly more light than the other cell. Consequently, the voltage responsive arrangement is used to advantage in installations wherein the intensity of the light source varies considerably.

The terminal 140 of the reader unit between the anode 58 and the cathode 56 of the cells 14*a* and 40*a* is connected to the voltage responsive translating device. As stated hereinbefore it has been observed that the voltage at the terminal 140 is rapidly switched between two values each time one of the cells receives more light than the other cell. For example, when the cell 14*a* receives more light than the cell 40*a*, voltage at the terminal 140 is rapidly switched from the value of voltage at the positive terminal of the lower section of the battery 62 to the value of voltage at the negative terminal of the upper section of the battery.

The terminal 140 is connected to the base 141a of a transistor 141 having also an emitter 141b and a collector 141c. The collector 141c is connected to a conductor 142 having a positive potential applied thereto. The transistor 141 is connected as an emitter follower and the current at the emitter 141b varies in accordance with the voltage at the terminal 140. The emitter 141b is connected to the base 143a of a transistor 143 having also an emitter 143b and a collector 143c. The emitter 143b is connected to ground and the collector 143c is connected to the conductor 142 through a resistor 144. The collector current of the transistor 143 varies in accordance with the emitter current of the transistor 141 and therefore varies in accordance with the voltage at the terminal 140. The output voltage is derived from an output terminal 145 connected to the collector 143c and varies in accordance with voltage at the terminal 140. Although the transistors 141 and 143 are shown in the form of NPN transistors, transistors of the PNP type may be employed if desired.

The voltage appearing at the terminal 145 is represented in FIG. 15 by the broken line curve 146 which is observed to have a generally rectangular waveform and which is switched between two extreme values in response to a very small angular movement of the information disk. The base-emitter current of the transistor 141 is represented in FIG. 15 by the full line curve 147 and it is noted that a decrease of the output voltage represented by the curve 146 is initiated when base current starts to flow, and that an increase of the output voltage is initiated slightly before the base current ceases to flow. The cells 14a and 40a of FIG. 14 may be replaced by semiconductor photodiodes or by any device having main electrodes from one of which electrons are generated in response to the application of radiant energy thereto.

Although the two cells of a reader unit are described as having equal output currents when the division lines are directly opposite the center lines of the mask slits, arrangements are possible for causing the cell output currents to be equal when the division lines are angularly spaced from the center lines of the mask slits.

The present invention may use various types of radiation-responsive devices and a source of radiation which is blocked or transmitted by the code wheel or information member. It is to be undertsood that where the term "light" is used, it is intended to encompass equivalent radiation and radiation-responsive sources and devices.

Although the invention has been described with reference to certain specific embodiments thereof, numerous modifications are possible and it is desired to cover all modifications falling within the spirit and scope of the appended claims.

Having described my invention, I claim:

1. In a coding device for converting an analog quantity to a digital quantity, a light source, a pair of reading devices responsive to light from said source and each providing output signals dependent upon the amounts of light applied thereto, an information member movable relative to said reading devices in accordance with the movement of a device the analog of which is to be converted for controlling the passage of light from said source to said devices and continuously illuminated by said source, said member having a zone including a single track including alternate light-transmitting and light-blocking portions disposed in end to end relationship and which have substantially equal dimensions in the direction of movement of the member and cause the light to be alternately blocked and transmitted to the respective ones of said devices, said reading devices each being responsive to the said portions of said single track and defining a reading line for said zone and being spaced by a distance which is an odd number multiple of said dimension so that the amounts of light applied to the reading devices and the output signals therefrom change in opposite directions substantially simultaneously during transitions of the light-transmitting and light-blocking portions in response to movement of the member past said reading line, and electric circuit means connected to said reading devices for producing an output quantity having a first condition when the output signal from one reading device is greater than the output signal from the other reading device and having a second condition different from said first condition when the output signal from said other reading device is greater than the output signal from the one reading device.

2. In a coding device for converting an analog quantity to a digital quantity, a light source, a pair of reading devices responsive to light from said source for providing currents having magnitudes dependent upon the amounts of light applied thereto, an information member continuously illuminated by said source and movable relative to said reading devices in accordance with the movement of a device the analog of which is to be converted for controlling the passage of light from said source to said devices, said member having a zone including alternate light-transmitting and light-blocking portions which have substantially equal dimensions in the direction of movement of the member and cause the light to be alternately blocked and transmitted to the respective ones of said devices, said reading devices defining a reading line for said zone and being spaced by a distance which is an odd number multiple of said dimension so that the amounts of light applied to the reading devices and the currents therefrom change in opposite directions substantially simultaneously during transitions of the light-transmitting and light-blocking portions in response to movement of the member past said reading line, each of said reading devices having an anode and a cathode, a connection connecting the anode of one reading device to the cathode of the other reading device, voltage source means having positive and negative terminals and an intermediate tap, said positive and negative terminals being connected respectively to the anode of said other reading device and to the cathode of said one reading device, and electric circuit means connected to a point in said connection and to said intermediate tap to produce an output quantity having a first condition when the signal from one reading device is approximately equal to or greater than the signal from the other reading device and driven to a second condition different from the first condition when the signal from the one reading device is less than the approximately equal relationship with respect to the signal from the other reading device.

3. A device as defined in claim 2 wherein said electric circuit means comprises a transistor having a base electrode connected to said point whereby the input current to render said transistor conductive is established through one of said reading devices and the input circuit of said transistor blocks current through the other of said reading devices.

4. A device as defined in claim 2 wherein said zone is nonsymmetrical relative to the reading line and said devices include connection means for selectively connecting the reading devices and said electric circuit means to direct voltage source means in two different circuit configurations so that the identical digital representations may be obtained for equal displacements of the disk in two opposite directions.

5. In an analog to digital converter, a zone comprised of alternate light-transmitting first portions and light-blocking second portions, first and second light responsive devices each disposed to be responsive to light from the part of said zone in a respective predetermined position relative to the reading device and alternately responsive to said first and second portions on relative movement between said devices and zone, the light on each of said devices being at a maximum extreme when the device is responsive to said first portion and at a minimum extreme when responsive to said second portion, a finite relative movement of said devices and member being required to effect a transition between said extremes of light during which the light on said devices progressively changes from one extreme to the other extreme, said devices being disposed along said zone such that as the light on one device is progressively changing in one direction between extremes the light on the other device is changing in the opposite direction between the extremes, and circuit means interconnecting said devices and providing an output signal having a first magnitude when a particular one of said reading devices is receiving more light than the other and progressively increasing and decreasing between said first magnitude and a second magnitude in response to the light on the devices increasing and decreasing between a condition where the light on the devices is substantially equal and a condition where the light is maximum on the other device.

6. In an analog to digital converter the structure as defined in claim 5 and further comprising additional circuit means responsive to said output signal to provide an output quantity which switches between two levels in response to said output signal increasing and decreasing to predetermined magnitudes beween said first and second magnitudes.

7. In an analog to digital converter the structure as defined in claim 5 wherein said reading devices are adapted to provide currents dependent on the light thereon and said circuit means comprises current responsive means responsive to the output current of said devices and operable to change said output signal from said first magnitude only when the current from said particular one device is greater than the current from the other of said devices.

8. A coding device comprising a code member having a zone thereon comprised of a single track having alternate light-transmitting and light-blocking portions of equal extent, light responsive devices for reading said zone, a mask for blocking light to said devices from said zone, said mask having slits of finite extent extending along the length of said zone for passing light to respective ones of said reading devices, said slits being positioned a distance apart corresponding to an odd number multiple of said portions, circuit means interconnecting said reading devices and providing an output signal of one extreme magnitude when the light from said zone on one particular device is greater than the light from said zone on the other and varying from said one extreme magnitude to a second extreme magnitude in accordance with the difference in light on said devices when the other device is receiving more light than said one device.

9. A coding device comprising a code member having a zone thereon comprised of alternate light-transmitting and light-blocking portions of equal extent, light responsive devices for reading said zone and providing an electrical signal dependent on the light on said devices, a mask for blocking light to said devices from said zone, said mask having slits of finite extent along the length of said zone for passing light to respective ones of said reading devices, said slits being positioned a distance apart corresponding to an odd number multiple of said portions, circuit means interconnecting said reading devices and providing an output signal of one extreme magnitude when the electric signal from a particular one of said devices is larger than the electric signal from the other device and varying from said extreme magnitude to a second extreme magnitude in accordance with the difference in the electric signals from said devices when the electric signal from the other device is greater than the signal from said particular one device.

10. A coding device as defined in claim 9 and including additional circuit means responsive to said output signal to provide an output quantity which switches between two levels in response to said output signals increasing and decreasing to predetermined magnitudes between said extreme magnitudes.

11. A coding device comprising a code member having a zone thereon comprised of alternate light-transmitting and light-blocking portions of equal extent, light responsive devices for reading said zone, a mask for blocking light to said devices from said zone, said mask having slits of finite extent along the length of said zone for passing light to respective ones of said reading devices, said slits being positioned a distance apart corresponding to an odd number multiple of said portions, the light on said devices being at a maximum and minimum extremes when responsive respectively to said light-transmitting and light-blocking portions, circuit means interconnecting said reading devices and providing an output signal of one extreme magnitude when the light on a particular one of said devices is between said extremes and is greater than that level necessary to provide a predetermined relationship to the light on the other device and varying from said extreme magnitude to a second extreme magnitude in accordance with the difference in light on said devices when the light on said one device is less than said level.

12. A coding device as defined in claim 11 and including additional circuit means responsive to said output signal to provide an output quantity which switches between two levels in response to said output signals increasing and decreasing to predetermined magnitudes between said extreme magnitudes.

13. In a coding device including a member having a zone of alternate light-blocking and light-transmitting portions and a pair of reading devices responsive to said portions and in which the transitions between portions to which said devices are responsive occur simultaneously in opposite directions on relative movement between said member and said devices whereby one device is responsive only to one of said portions the other is responsive only to the other of said portions and the devices are each responsive equally to adjacent ones of said first and second portions and receive substantially equal light from said zone at an intermediate point of a transition, circuit means interconnecting said reading devices and providing an output signal of one extreme magnitude when the light on one particular device is greater than a predetermined relationship to the light on the other which relationship occurs during a transition between portions and varying from said extreme magnitude to a second extreme magnitude in accordance with the difference in light on said devices when the light on said one particular device is less than said predetermined relationship to the light on said other device.

14. In a coding device including a member having a zone of alternate light-blocking and light-transmitting portions and a pair of reading devices responsive to said portions in which transitions between portions to which said devices are responsive occur simultaneously in opposite directions on relative movement between said member and said devices whereby when one device is responsive only to one of said portions the other is responsive only to the other of said portions and the devices are each responsive equally to adjacent ones of said first and second portions and at an intermediate point of a transition, said devices each providing electric signals dependent on the light thereon, circuit means interconnecting said reading devices and providing an output signal of one extreme magnitude when the electric signal from one particular device is larger than the electric signal from the other and varying from said extreme magnitude to a second extreme magnitude in accordance with the difference in electric signals from said devices when the electric signal from said other device is greater than that from said one particular device.

15. In a coding device, the structure as defined in claim 14, wherein said signals are current signals and said circuit means comprises a transistor having its input circuit connected to said reading devices and rendered conductive when the output current from the device other than said one particular device is larger than the current from said one particular device, said input circuit blocking current flow through said one particular device and said input circuit.

16. A reading means for a code member including a zone having alternate opaque and light transmitting portions comprising first and second photoelectric reading devices disposed adjacent said zone to receive light therefrom with the devices being located opposite corresponding parts of different ones of said portions simultaneously whereby the light on said devices changes simultaneously in different directions as the dividing line between adjacent portions moves past said devices, a source of voltage having an intermediate tap, said devices being connected in series across said source of voltage, and electrical means connected between said tap and a junction between said devices including an electric valve having a cut-off condition when the output of a particular one of said devices is greater than the other and a conductive condition when its output is less than the other.

References Cited by the Examiner

UNITED STATES PATENTS

| | | | |
|---|---|---|---|
| 2,793,807 | 5/1957 | Yaeger | 340—347.4 |
| 2,966,671 | 12/1960 | Abbott et al. | 340—347 |
| 2,993,200 | 7/1961 | Walker | 340—347.4 |

MALCOLM A. MORRISON, *Primary Examiner.*

STEPHEN W. CAPELLI, LLOYD W. MASSEY, *Examiners.*